United States Patent
O'Shea et al.

(10) Patent No.: US 12,003,244 B2
(45) Date of Patent: Jun. 4, 2024

(54) DYNAMIC CONFIGURATION OF SPUR CANCELLATION

(71) Applicant: Apple Inc., Cupertino, CA (US)

(72) Inventors: Helena Deirdre O'Shea, San Jose, CA (US); Dmitry Cherniavsky, San Jose, CA (US); Tim Schoenauer, Bavaria (DE); Ali Moaz, Bayern (DE); Rahmi Hezar, San Francisco, CA (US); Ram Kanumalli, Linz (AT)

(73) Assignee: APPLE INC., Cupertino, CA (US)

( * ) Notice: Subject to any disclaimer, the term of this patent is extended or adjusted under 35 U.S.C. 154(b) by 238 days.

(21) Appl. No.: 17/469,272

(22) Filed: Sep. 8, 2021

(65) Prior Publication Data

US 2023/0072903 A1    Mar. 9, 2023

(51) Int. Cl.
H04B 1/10 (2006.01)
G06F 1/08 (2006.01)
G06F 13/40 (2006.01)
H03K 5/1252 (2006.01)

(52) U.S. Cl.
CPC .......... *H03K 5/1252* (2013.01); *G06F 1/08* (2013.01); *G06F 13/4027* (2013.01)

(58) Field of Classification Search
CPC .... H04B 1/10; H04B 1/14; G06F 1/08; G06F 13/4027; H03K 5/1552
See application file for complete search history.

(56) References Cited

U.S. PATENT DOCUMENTS

| | | |
|---|---|---|
| 2010/0137025 A1 | 6/2010 | Tal et al. |
| 2014/0197875 A1 | 7/2014 | Potty et al. |
| 2015/0126128 A1* | 5/2015 | Youngblood .......... H04B 15/00 455/63.1 |
| 2016/0126992 A1 | 5/2016 | Hu et al. |
| 2016/0359493 A1 | 12/2016 | Chen et al. |
| 2017/0078993 A1 | 3/2017 | Ogasawara |
| 2019/0042510 A1 | 2/2019 | Ngau et al. |
| 2020/0162083 A1 | 5/2020 | Rangachari et al. |

OTHER PUBLICATIONS

PCT International Search Report and Written Opinion, PCT Application No. PCT/US2022/033105, dated Sep. 29, 2022, 15 pages.

* cited by examiner

*Primary Examiner* — Blane J Jackson
(74) *Attorney, Agent, or Firm* — Sterne, Kessler, Goldstein & Fox P.L.L.C.

(57) ABSTRACT

Embodiments relate to updating spur cancellation at a victim integrated circuit (IC) in accordance with dynamic changes in the operating frequencies of an aggressor IC. The aggressor IC changes its operating frequencies at an update time that is determined in advance. The update time and the changes to the operating frequencies are shared with the victim IC. The victim IC dynamically updates the relationships between frequencies of local clock signals for the victim IC and the aggressor IC. The victim IC generates a spur cancellation parameter based on the updated relationships of local clock frequencies, the update time and the changes to the operating frequencies of the aggressor IC, and configures a spur cancellation circuit. In this way, the victim IC may perform effective spur cancellation despite changes in the operating frequencies of the aggressor IC and deviation of the local clock frequencies.

20 Claims, 8 Drawing Sheets

| Protection Info | |
|---|---|
| Priority 1 | 1710-1755 (MHz) |
| Priority 2 | 2500-2570 (MHz) |
| Priority 3 | 788-798 (MHz) |
| Priority 4 | 1850-1910 (MHz) |
| ⋮ | ⋮ |
| Other Info | Transmitted data type, signal strength, active comm. subsystem, etc. |

*FIG. 9*

DYNAMIC CONFIGURATION OF SPUR CANCELLATION

BACKGROUND

1. Field of the Disclosure

The present disclosure relates to cancellation of spurs by an integrated circuit (IC) chip in an electronic device.

2. Description of the Related Art

An electronic device may include circuits for implementing multiple functions and communication standards. Such functions and standards include various wireless communication standards as well as various sensors. Due to a multiplicity of the operating frequencies and the physical proximity between the circuits associated with these functions and standards, spurs generated from a circuit in an electronic device may interfere or disrupt operations of another circuit in the same electronic device. If the spurs fall near the operating frequency of a victim circuit, the spurs may lead to degradation of signal-to-noise ratio (SNR) of signals at the victim circuit and mixing of undesirable noise into the signals. Various techniques ranging from frequency planning to clock spreading have been developed. However, these techniques are inappropriate to mitigate spurs that change over time as circuits dynamically change their operating frequencies.

SUMMARY

Embodiments relate to a first integrated circuit (IC) performing spur cancellation on spurs generated by a second IC. The second IC dynamically changes its operating frequencies during its operation. After a start time, the second IC operates with one or more first operating frequencies. Hence, the first IC performs spur cancellation to mitigate or remove spurs associated with the second IC's operation with the one or more first operating frequencies. After an update time, the second IC operates with one or more second operating frequencies. Hence, the first IC performs spur cancellation to mitigate or remove spurs associated with the second IC's operation with the one or more second operating frequencies. The first IC may also track changes in a local clock frequency for the second IC to determine the relationship between a local clock frequency for the first IC and the local clock frequency of the second IC to more accurately perform the spur cancellation.

BRIEF DESCRIPTION OF THE DRAWINGS

Figure (FIG. 1 is a high-level diagram of an electronic device, according to one embodiment.

FIG. 9 is a diagram illustrating data fields in protection information generated by the victim IC, according to one embodiment.

Figure 1:
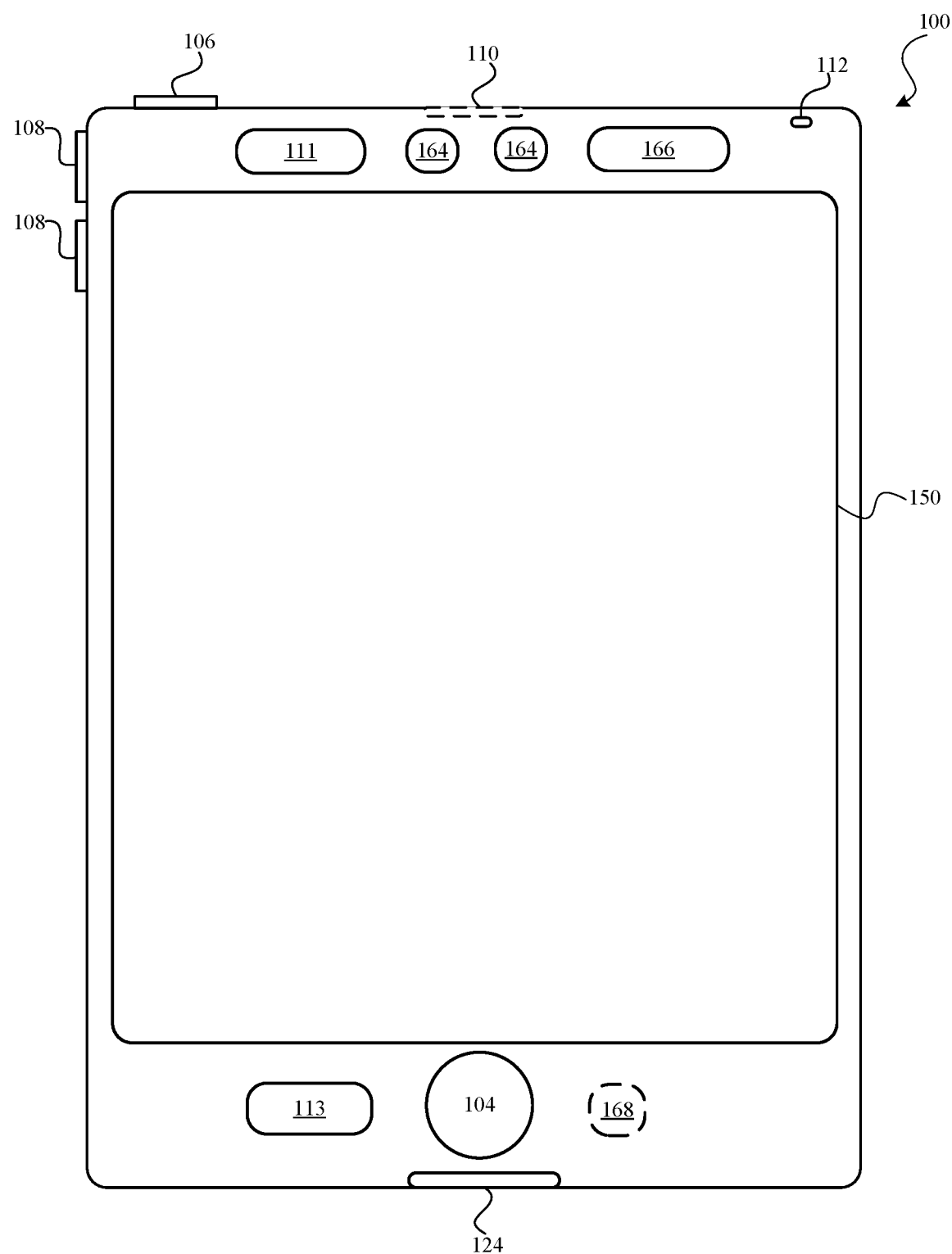

The figures depict, and the detailed description describes various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to updating spur cancellation at a victim integrated circuit (IC) in accordance with dynamic changes in the operating frequencies of an aggressor IC. The aggressor IC changes its operating frequencies at an update time that is determined in advance. The update time and the changes to the operating frequencies are shared with the victim IC. The victim IC dynamically updates the relationships between frequencies of local clock signals for the victim IC and the aggressor IC. The victim IC generates a spur cancellation parameter based on the updated relationships of local clock frequencies, the update time and the changes to the operating frequencies of the aggressor IC. The spur cancellation parameter is used for configuring a spur cancellation circuit. In this way, the victim IC may perform effective spur cancellation despite changes in the operating frequencies of the aggressor IC and deviation of the local clock frequencies.

An aggressor IC described herein refers to an IC that generates spurs interfering with the operation of another IC. The spurs may be a function of a local clock signal provided to the aggressor IC.

A victim IC described herein refers to an IC subject to interference by the spurs generated by an aggressor IC. The victim IC may be, for example, a wireless communication system.

Although a victim IC is a counterpart to an aggressor IC, the victim IC and the aggressor IC may be interchanged depending on the operating status of the victim IC and the aggressor IC. That is, the same IC may become a victim IC when experiencing interference from spurs generated by another IC while the same IC may become an aggressor IC when it generates spurs that interfere with the operations of the other IC.

Example Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, California Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure (FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. Device 100 may include more than one type of image sensors 164. Each type may include more than one image sensor 164. For example, one type of image sensors 164 may be cameras and another type of image sensors 164 may be infrared sensors that may be used for face recognition. In addition or alternatively, image sensors 164 may be associated with different lens configuration. For example, device 100 may include rear image sensors, one with a wide-angle lens and another with as a telephoto lens. Device 100 may include components not shown in FIG. 1 such as an ambient light sensor, a dot projector and a flood illuminator.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). While the components in FIG. 1 are shown as generally located on the same side as touch screen 150, one or more components may also be located on an opposite side of device 100. For example, front side of device 100 may include an infrared image sensor 164 for face recognition and another image sensor 164 as the front camera of device 100. The back side of device 100 may also include additional image sensors 164 as the rear cameras of device 100.

Example System in System Including Multiple ICs

Figure 2:
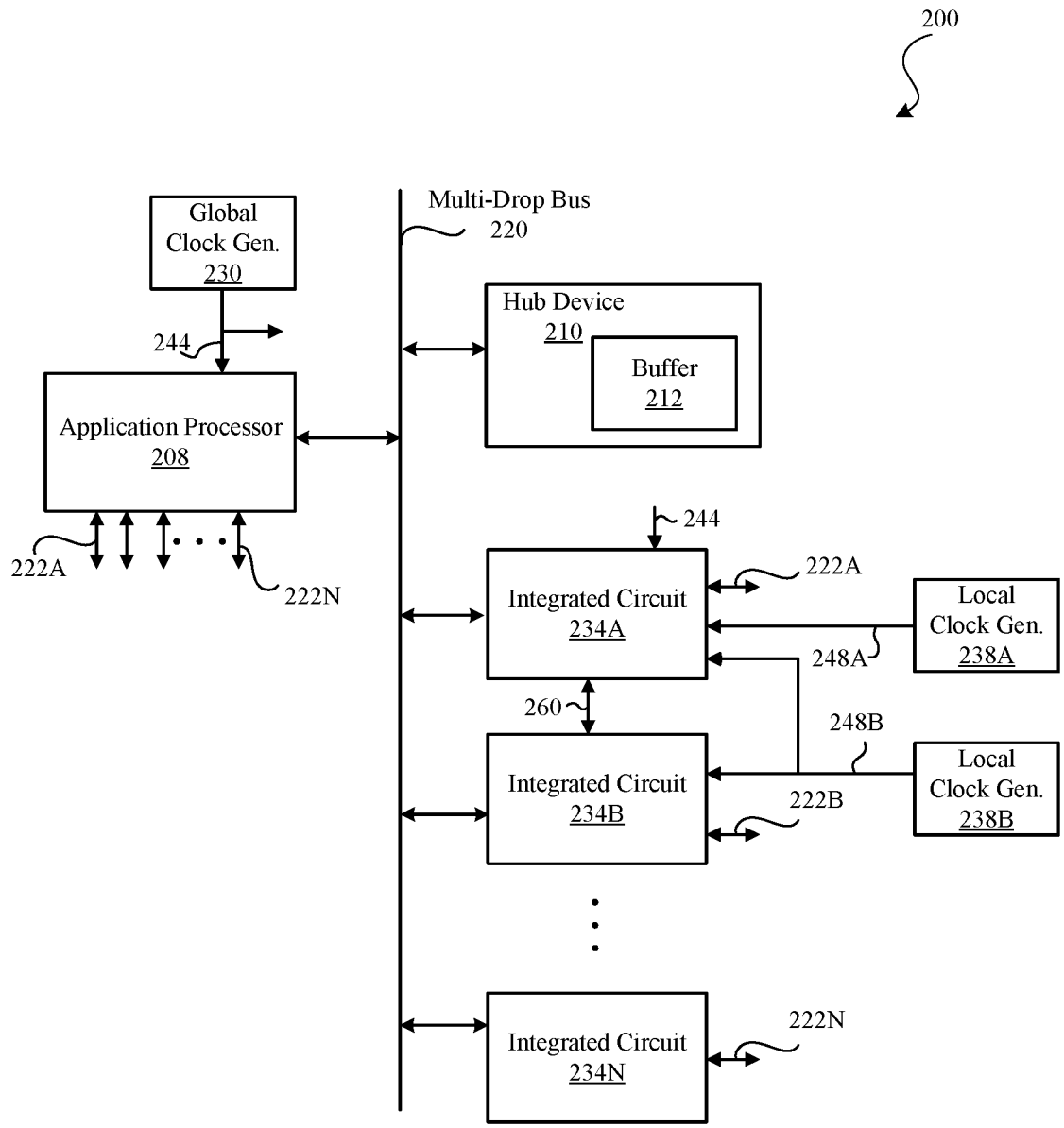
FIG. 2 is a block diagram illustrating a systems of the electronic device including multiple integrated circuits (ICs) communicating over a multi-drop bus, according to one embodiment.

FIG. 2 is a block diagram illustrating a system 200 of electronic device 100 including multiple integrated circuits (ICs) communicating over a multi-drop bus 220, according to one embodiment. Electronic device 100 may include, among other components, an application processor 208 (also referred to as "a central processor"), a hub device 210, ICs 234A through 234N (collectively referred to as "ICs 234" herein), multi-drop bus 220, fabrics 222A through 222N (collectively referred to as "fabrics 222" herein) and local clock generation circuits 238A, 238B. Electronic device 100 may include additional components (e.g., user interfaces) not illustrated in FIG. 2.

Application processor 208 is a processing circuit in electronic device 100 for executing various operations. Application processor 208 may include one or more processing cores for executing various software programs as well as dedicated hardware circuits for performing specialized functions such as processing images, performing security operations, performing machine learning operations, and processing audio signals. Application processor 208 may also execute operations to coordinate the operations of other components in electronic device 100 including hub device 210 and ICs 234. Application processor 208 may comprise firmware or hardware for the end-to-end functional behavior of a given IC. For example, IC 234B may not be fully independent, and IC 234B may rely on application processor 208 to coordinate its operation with other ICs, e.g., IC 234A. Application processor 208 may also incorporate one or more components (e.g., cellular modem) that may also be embodied as a separate IC.

Hub device 210 is hardware, software firmware or a combination thereof, that coordinates the operations of multiple ICs 234 and related components in electronic device 100. For this purpose, hub device 210 may store and execute an operation policy for defining and/or coordinating the operations of the ICs 234 and the related components. By locally coordinating operations of ICs instead of relying upon application processor 208, application processor 208 may be retained in the low power mode for a longer time despite activities in system 200, and also free the resources of application processor 208 during its high-power mode. Hub device 210 may include, among other components, buffer 212 that stores states of ICs 234 or messages to be interchanged between ICs 234. When ICs 234 wake up from a sleep mode, ICs 234 may retrieve relevant state information and/or messages from buffer 212 via multi-drop bus 220. Although not illustrated in FIG. 2, hub device 210 may also control the operations or access to one or more antennas, RF switches, shared/co-dependent RF components or sensors (not shown) associated with system 200.

Each of ICs 234 is a circuit that, by itself or in conjunction with software or firmware, performs specified operations. The specified operations include, for example, implementing wired or wireless communication protocol, processing sensor signals, and performing specialized computing operations. At least a portion of the firmware and/or software for a behavior of any of ICs 234 may reside, e.g., on application processor 208 due to the complexity of interactions with other components on multi-drop bus 220. A pair of ICs (e.g., IC 234A and IC 234B) may communicate through a point-to-point communication channel 260 or a general-purpose input/output set of (GPIOs) (not shown) to mitigate or cancel spurs from one IC (e.g., 234B) from interfering with the operation of another IC (e.g., 234A). In the example described below with reference to FIGS. 3 and 4, IC 234A is a victim IC that mitigates or cancels spurs generated by IC 234B, which functions as an aggressor IC.

Fabrics 222 are communication channels enabling components in the communication system to communicate with application processor 208. One or more of fabrics 222 may be embodied as point-to-point connections such as Peripheral Component Interconnect Express (PCIe), I2C, Serial Peripheral Interface (SPI), Universal Asynchronous Receiver-Transmitter (UART) connection, or some other point-to-point connection. As illustrated in FIG. 2, ICs 234A through 234N communicate with application processor 208 via corresponding fabrics 222A through 222N. One or more of fabrics 222 may have high bandwidth and low latency compared to multi-drop bus 220. Fabrics 222 illustrated in FIG. 2 may be physically separate communication channel or one or more shared physical channels with multiple logical sub-channels.

Multi-drop bus 220 is a communication channel that enables multiple components of system 200 to communicate over a shared connection. Multi-drop bus 220 may be used primarily to transmit messages between components in system 200. However, multi-drop bus 220 may also transmit other types of signals. Further, multi-drop bus 220 may be divided into more buses. In one or more embodiments, System Power Management Interface (SPMI) is used to embody multi-drop bus 220. Other serial bus interfaces such as I2C may be used instead of the SPMI to embody multi-drop bus 220.

Global clock generation circuit 230 is a circuit that generates a global clock signal 244 for coordinating the operations across different components in system 200. Global clock signal 244 may be provided to, for example, application processor 208 and IC 234B to coordinate activities. Messages may be communicated between components of system 200 to indicate timing in terms of clock cycles of global clock signal 244.

Local clock generation circuit 238A is a circuit that generates local clock signal 248A to synchronize the operation of IC 234A. Although local clock generation circuit 234A is illustrated in FIG. 2 as being a component separate from IC 234A, local clock generation circuit 234A may be included within IC 234A. In one or more embodiments, local clock signal 248A has a higher frequency than that of global clock signal 244.

Similarly, local clock generation circuit 238A generates local clock signal 248B to synchronize the operation of IC 234B. Local clock generation circuit 234B may also be included within IC 234B. Local clock signal 248B is also provided to IC 234A so that IC 234A can perform spur cancellation on spurs generated by IC 234B, as described below in detail with reference to FIG. 3. In one or more embodiments, local clock signal 248B has a higher frequency than that of global clock signal 244.

Although aggressor IC 234B and victim IC 234A are illustrated as being connected to multi-drop bus 220, one or both of aggressor IC 234B and victim IC 234A may not be connected to multi-drop bus 220. One or more ICs not connected to multi-drop bus 220 may communicate, for example, via another IC (e.g., application processor 208).

Example Architecture of Victim IC

Figure 3:
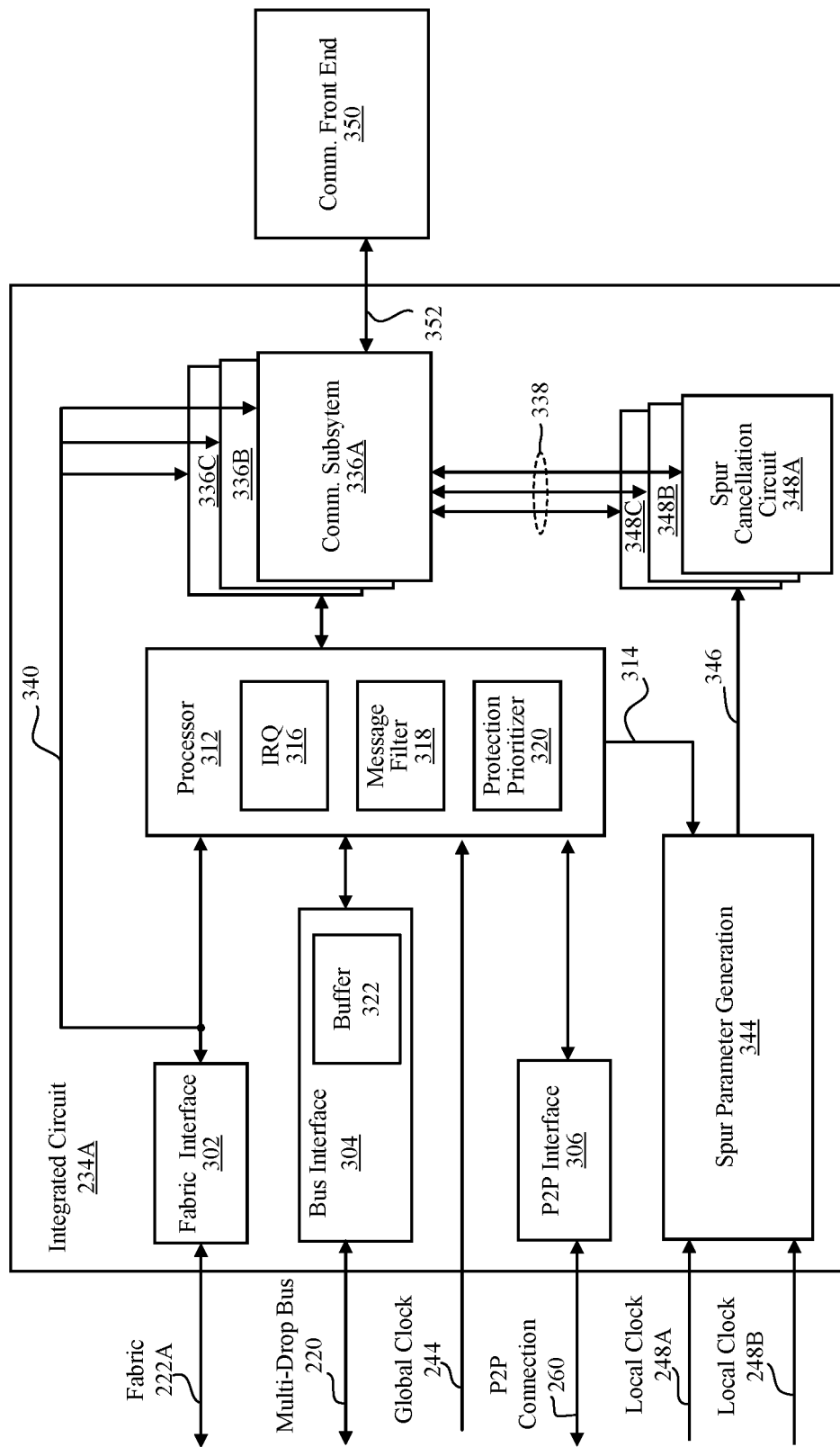
FIG. 3 is a block diagram illustrating a victim IC performing spur cancellation, according to one embodiment.

FIG. 3 is a block diagram illustrating IC 234A that performs spur cancellation on spurs generated by IC 234B, according to one embodiment. In other words, IC 234A is the victim IC, and IC 234B is the aggressor IC. IC 234A is, for example, a communication IC that performs communication with another electronic device using wireless communication protocols such as a mobile communication standard and/or wireless network protocols. In other embodiments, the victim IC may be an IC that performs other functions such as processing sensor signals.

To execute one or more communication protocols, IC 234A may include communication subsystems 336A, 336B, 336C (collectively referred to as "communication subsystems 336"). Although only three communication subsystems 336A, 336B, 336C are illustrated in FIG. 3, more than three communication subsystems or fewer than three communication subsystems may be included in IC 234A. Each of communication subsystems 336 may be associated with different communication protocols, or they may be associated with the same communication protocol. Communication subsystems 336 may receive configuration signals from application processor 208 via fabric interface 302 and line 340. The configuration signals enable application processor 208 to configure the operations of communication subsystems 336 directly without involving processor 312. The communication subsystems 336 interacts with communication front end 350 via connection 352. In one or more embodiments, the communication front end 350 is a RF front end that provides a digital version of a RF signal to one or more of the communication subsystems 336.

IC 234A also includes spur cancellation circuits 348A through 348C (collectively referred to as "spur cancellation circuits 348") for performing spur cancellation. A spur cancellation circuit may function as a notch filter having a notch frequency and/or a notch bandwidth that are adjustable according to spur parameters 346. Each of the communication subsystems 336 may be paired with a corresponding spur cancellation circuit 348 to perform spur cancellation on communication signals received via connection 352. The operation of IC 234B, acting as the aggressor IC, dynamically changes with the progress of time. Such dynamic changes may accompany changes in the operating frequencies of IC 234B. Hence, one or more of spur cancellation circuits 348 are configured via spur parameter 346 to adjust their operations in accordance with the dynamic change in the operating frequencies of IC 234B, as described below in detail with reference to FIGS. 5A and 5B. In one or more embodiments, spur cancellation circuits 348 may be embodied as a digital signal processing (DSP) circuit, as well known in the art.

IC 234A may include interface circuits for communicating with other components of system 200. Such interface circuits may include, for example, fabric interface 302, bus interface 304, and point-to-point (P2P) interface 306. Bus interface 304 is a circuit that, by itself or in conjunction with software or hardware, enables components of IC 234A to communicate with hub device 210 and other ICs 234B through 234N over multi-drop bus 220. In one or more embodiments, bus interface 304 includes a buffer 322 for storing messages over multi-drop bus 220. Buffer 322 remains active to store inbound messages even when other components (e.g., processor 312 and communication subsystems 336) of IC 234A are in a sleep mode, and makes the stored messages available to the communication subsystems 336, when they wake up from the sleep mode. Such buffer 322 may be used in addition to or in lieu of buffer 212 in hub device 210 to enable IC 234B to communicate at any time with IC 234A.

Fabric interface 302 is a circuit that, by itself or in conjunction with software or hardware, enables components of IC 234A to communicate with application processor 208 over fabric 222A. The communication of fabric interface 302 is capable of transmitting data at a faster speed and higher bandwidth than the communication over bus interface 304.

P2P interface 306 is a circuit that, by itself or in conjunction with software or hardware, enables processor 312 to communicate with another IC (e.g., IC 234B) over P2P connection 260. P2P interface 306 may be embodied, for example, by PCIe. P2P interface 306 may be used to receive or transmit information that is time-sensitive. In other embodiments, P2P interface 306 may be replaced with a direct connection such as general purpose input/output (GPIO).

In addition, IC 234B may include, among other components, processor 312 and spur parameter generation circuit 344. Processor 312 is a circuit that manages overall operation of IC 234A. Processor 412 may include, among others, an interrupt manager 316, a message filter 318 and a protection prioritizer 320 as software or hardware components for, e.g., identifying which incoming messages apply for the current operating conditions of IC 234A, along with running the wireless communications protocol software. Interrupt manager 316 is a hardware, software, firmware or a combination thereof that manages interrupts. When interrupt manager 316 receives a message (e.g., via multi-drop bus 220) including an interrupt, interrupt manager 316 extracts the interrupt and sends out one or more interrupt signals to communication subsystem 336. Interrupt signals can cause communication subsystem 336 to shut down, power down a subset of its components, wake-up from a power down mode or indicate real time state of components on multi-drop bus 220.

Message filter 318 is hardware, software, firmware or a combination thereof that receives inbound messages from multi-drop bus 220 via bus interface 304, filters inbound messages for relevancy before sending filtered messages to communication subsystem 336. If an inbound message includes an interrupt, message filter 318 sends the corresponding message to interrupt manager 316.

Processor 312 also receives global clock signal 244 from global clock generation circuit 230. Global clock signal 244 may be used to synchronize the timing of operations in IC 234A with other components (e.g., application processor 208, hub device 210, and ICs 234B through 234N) of system 200. In one or more embodiments, global clock signal 244 is used by processor 312 for determining the start time or update times of operations at IC 234B. Specifically, processor 312 may analyze operation information of IC 234B received over multi-drop bus 220 or P2P connection 260, determine the times when spurs will start occurring or when the characteristics (e.g., frequencies) of the spurs will change (as described below in detail with reference to FIGS. 5A and 5B), convert such times in terms of a local clock as represented by local clock signal 248A, and include timing information in operation information 314 sent to spur parameter generation circuit 344.

Protection prioritizer 320 is hardware, software, firmware or a combination thereof for generating protection information for sending to an aggressor IC (e.g., IC 234B). Protection prioritizer 320 determines the operating status of communication subsystems 336, including bands of frequencies to be protected for an effective operation of communication subsystems 336 and other information such as types of data being transmitted by certain bands of frequencies, signal strength of signals transmitted over the frequencies, and active/inactive states of communication subsystems 336, as described below in detail with reference to FIG. 9. Such information is included in the protection information. The protection information is sent to IC 234B over P2P connection 260 or multi-drop bus 220 so that IC 234B may configure its operation so that spurs interfering with the operation of IC 234A can be mitigated or removed. Alternatively, the protection information may be sent over fabric 222A to application processor 208, if IC 234B is controlled by software executed on application processor 208.

Spur parameter generation circuit 344 is hardware, software, firmware or a combination thereof for generating spur parameters 346 used for configuring spur cancellation circuits 348. To generate the spur parameters, spur parameter generation circuit 344 receives operation information 314 and local clock signals 248A, 248B Then, spur parameter generation circuit 344 replicates the possible locations of spurs using operation information 314 and the frequency relationships of local clocks 248A, 248B. Based on the possible locations of spurs, spur parameter generation circuit 344 identifies whether RF operating channels of communication subsystems 336 are subject to interference. Spur parameters 346 indicate the frequencies of the spurs, whereas messages indicated over multi-drop bus 220 indicates the timing when the spurs will be active. The details of the function of spur parameter generation circuit 344 are described below in detail with reference to FIGS. 5A, 5B and 6.

Example Architecture of Aggressor IC

Figure 4:
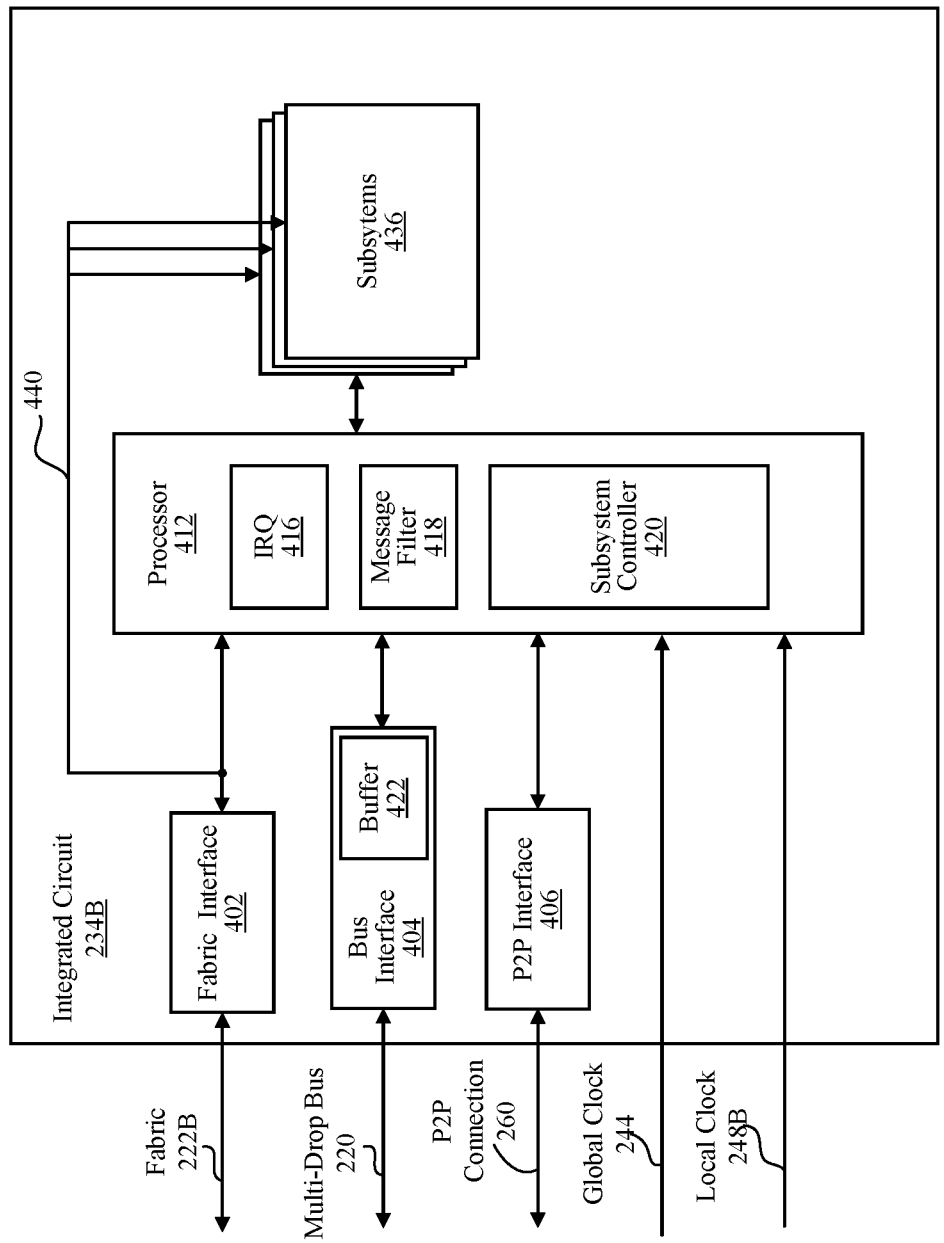
FIG. 4 is a block diagram of an aggressor IC that dynamically changes its operating frequencies, according to one embodiment.

FIG. 4 is a block diagram of IC 234B that generates spurs, according to one embodiment. IC 234B may include, among other components, processor 412, subsystems 436 and various interfacing circuits (e.g., fabric interface 402, bus interface 404, and P2P interface 406). In one or more embodiments, IC 234B is a circuit for operating a sensor such as a Lidar system. In other embodiments, IC 234B is a circuit implementing a wireless communication protocol such as Bluetooth. Bus interface 404 may include buffer 422 that has the same function as buffer 322.

Subsystems 436 include circuits for performing various operations such as sensing or communication. As a result of their operations, one or more of subsystems 436 generate spurs that may interfere with the operations of IC 234A. One or more of subsystems 436 change their operating frequencies and/or timing dynamically in a predetermined manner, and hence, also changes the characteristics of the spurs in a predictable way.

Processor 412 is a circuit that manages the overall operations of IC 234B. Processor 412 may include, among other components, interrupt manager 416, message filter 418 and subsystem controller 420. The functions and operations of interrupt manager 416 and message filter 418 are the same as interrupt manager 316 and message filter 318 of FIG. 3, respectively, and therefore, detailed explanation thereof is omitted herein for the sake of brevity. Subsystem controller 420, after receiving priority information from IC 234A, may configure one or more of subsystems 436 to mitigate or prevent spurs they generate from interfering with prioritized or selected frequencies associated with IC 234A, as described below in detail with reference to FIG. 9. The configurations of one or more subsystems 436 by processor 412 according to the priority information may be used in addition to or in lieu of spur cancellation at IC 234A.

Processor 412 may also generate an outgoing message including operation information indicating, among others, a start time or update times of operations at subsystems 436 that are associated with generation of spurs, as described below in detail with reference to FIG. 5. The outgoing message may be sent to IC 234A via multi-drop bus 220 or P2P connection 260. The start time or update times may be expressed in terms of a global time indicated by global clock signal 244. For this purpose, processor 412 receives local clock signal 248B as well as global clock 244. In one or more embodiments, the outgoing message including the operation information may be sent to hub device 210 for storing in buffer 212. The operation information may be subsequently retrieved by IC 234A from buffer 212, for example, after IC 234A wakes up from a sleep mode.

Subsystems 436 are hardware, software, firmware or a combination thereof for performing various operations. Such operations may include controlling of a sensor (e.g., Lidar), and processing signals for wireless communication (e.g., Bluetooth). Each of subsystems 436 may operate in conjunction with each other or independently of each other. In some embodiments, at least one of subsystems 436 operates in a repeating sequence of different intervals and/or be placed in a sleep mode between intervals, as described below in detail with reference to FIGS. 5A and 5B. The subsystems 436 may be configured by subsystem controller 420 or by a control command received from another component of system 200 received via fabric interface 402 and line 440. Although IC 234B is described as including multiple subsystems 436, IC 234B may include only a single subsystem.

Example Operation of Generating Spur Parameter

Spur parameter generation circuit 344 generates spur parameters 346 to account for dynamic changes in the operations of IC 234B. Further, spur parameter generation circuit 344 may also account for drifts in frequencies of local clock signals 248A, 248B when generating spur parameters 346. Accordingly, spur cancellation circuits 348 may be configured by spur parameters 346 to effectively mitigate or cancel the spurs generated by IC 234B despite changes in the operating conditions of IC 234B and/or frequencies of local clock signals 248A, 248B.

Figure 5A:
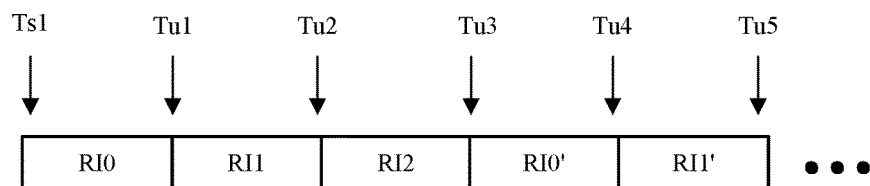
FIGS. 5A and 5B are timing diagrams illustrating a repeating sequence of intervals with different operating frequencies in the aggressor IC, according to one embodiment.

FIG. 5A is a timing diagram illustrating a repeating sequence of intervals with different operating frequencies in one or more subsystems 436 of IC 234B, according to one embodiment. In the example of FIG. 5A, the one or more subsystems repeat a sequence of three intervals (e.g., RI0, RI1, RI2) followed by another sequence of three intervals (e.g., RI0', RI1', RI2'). The corresponding intervals in the sequences may have the same operating frequency. That is, intervals RI0 and RI0', RI1 and RI1', RI2 and RI2' may have the same operating frequencies. In one or more embodiments with fixed lengths of the intervals, spur parameter generation circuit 344 may be provided with start time Ts1 of the first interval RI0 so that spur parameter generation circuit 344 may estimate subsequent update times Tu1 through Tu5 at which the operating frequencies are updated at IC 234B by adding the fixed lengths of the intervals to start time Ts1. If the lengths of intervals are variable, update times (e.g., Tu1 through Tu5) may be provided in addition to start time Ts1 to spur parameter generation circuit 344 to enable spur parameter generation circuit 344 to identify the update times. Alternatively, information on the varying lengths of intervals may be provided to spur parameter generation circuit 344 so that the update times (e.g., Tu1 through Tu5) can be derived from start time Ts1.

Information about timing of the intervals (e.g., start time Ts1, update times Tu1 through Tu5 and lengths of intervals) may be included in operation information 314. In one or more embodiments, operation information 314 may be received from IC 234B via multi-drop bus 220 or P2P connection 260. That is, operation information 314 may be included in a message from IC 234B, which is filtered and decoded at message filter 318 to extract operation information 314. Alternatively, operation information 314 may be received from hub device 210 or application processor 208 via multi-drop bus 220 or fabric 222A. In yet other embodiments, part of operation information 314 (e.g., start time) may be received from IC 234A while the remaining part of operation information 314 (e.g., lengths of intervals) may be received from hub device 210.

Information about the repeating sequence of intervals, their operating frequencies and/or start/update times may be received in a single or multiple messages at IC 234A. The message may be received directly from IC 234B or received via buffer 212 of hub device 210 that temporarily stores the message. In one or more embodiments, buffer 212 may store the sequence of intervals and related information and send a message including such information to IC 234A at a time over multi-drop bus 220 according to a collision detection and avoidance scheme.

Figure 5B:
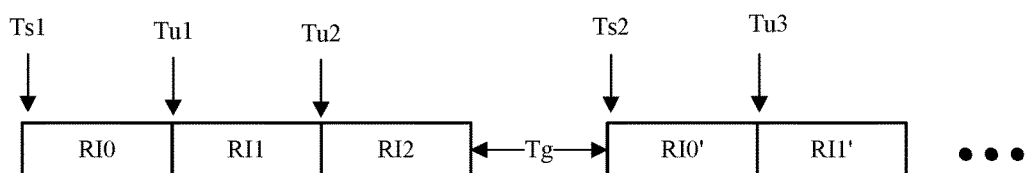

FIG. 5B is a timing diagram illustrating a repeating sequence of intervals when IC 234B is placed in a sleep mode during gap period Tg, according to one embodiment. In such embodiment, the spur parameter generation circuit 344 may be provided with second start time Ts2 after returning to an active mode after the sleep mode. Operation information 314 from other components of system 200 may further include second start time Ts2 or the length of gap period Tg. Gap period Tg may be used in some circumstances to protect the victim IC (e.g., IC 234A) from repeated exposure to spurs. The aggressor IC (e.g., IC 234B) may include some operational modes with gap period Tg so that one of the degrees of freedom for the victim IC is for the aggressor IC to use gap period Tg that results in some compromise in performance but balances the performance of the victim systemic against exposure to sustained and damaging from spurs generated by the aggressor IC.

In one or more embodiments, timing information (e.g., start times, update times, lengths of intervals, and the length of gap period) in a message from IC 234B, application processor 208 or hub device 210 may be expressed in terms of global clock signal 244. After receiving the message, processor 312 of IC 234A may convert such timing information to timing information expressed in terms of local clock signal 248A and send revised operating information 314 to spur parameter generation circuit 344.

Spur parameter generation circuit 344 may also determine the relationships between local clocks 248A, 248B. Although nominal frequencies of local clocks 248A, 248B may be known, these frequencies may drift due to temperature/pressure changes or supply voltage variations. Hence, spur parameter generation circuit 344 periodically updates the relationships between the two local clocks 248A, 248B, and provide the updated relationships to spur cancellation circuits 348 as part of spur parameters 346 so that spur cancellation can be performed effectively despite the drift.

Figure 6:
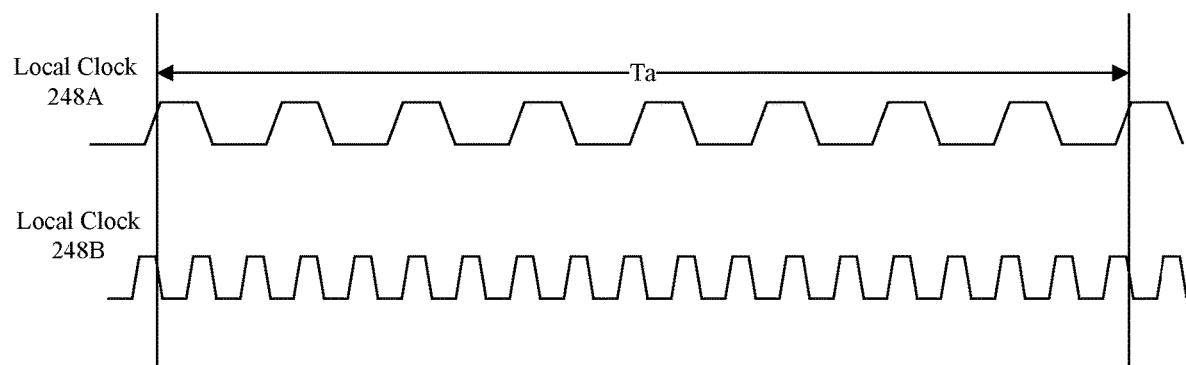
FIG. 6 is a signal diagram illustrating the relationships between local clock signals for the victim IC and the aggressor IC, according to one embodiment.

Because the frequencies of local clock signals 248A, 248B may drift over time due to various reasons, spur parameter generation circuit 344 further determines the relationships between local clock signals 248A, 248B. An example method of determining the relationship between the frequencies of two local clock signals 248A, 248B is described with reference to FIG. 6. FIG. 6 is a timing diagram of two local clock signals 248A, 248B, according to one embodiment. For a sample time Ts that may be defined as a predetermined number of cycles of local clock signal 248A, the number of cycles in local clock signal 248B is counted. One way of determining the number of cycles in local clock signal 248B is by counting the number of edges during sample time Ts. The edges for this purpose may be rising edges, falling edges or both. The count of edges in local clock signal 248A and the count of edges in local clock signal 248B over sample period time Ts are tallied by spur parameter generation circuit 344. Then, the relationships between the two local clock signals 248A, 248B are indicated as a ratio between the counts of the edges during sample time Tx. Such ratio may be updated continuously after each sampling time Ts or be updated periodically by spur parameter generation circuit 344. The ratio may be sent to spur cancellation circuits 348 as part of spur parameters 346.

When IC 234B starts with one or more operating frequencies at start time Ts1, spur parameter generation circuit 344 determines a ratio of clock counts at an initial time before start time Ts1 and sends it to the spur cancellation circuits 348 as spur parameter 346 to perform spur cancellation during the first interval RI0. Then, spur parameter generation circuit 344 updates the ratio of clock counts at a subsequent time before an update time (e.g., Tu1), and sends the updated ratio to spur cancellation circuits 348 as a subsequent spur parameter 346 to perform spur cancellation during a subsequent interval (e.g., RI1). Because the updated ratio at the subsequent time is closer to the actual ratio of frequencies of the two local clocks during the subsequent interval (e.g., RI1) than the initial ratio determined at the initial time, spur cancellation circuits 348 may perform more effective spur cancellation in the subsequent interval by using the more accurate ratio.

Example Using Reference Signal to Determine Local Clock Relationships

Figure 7:
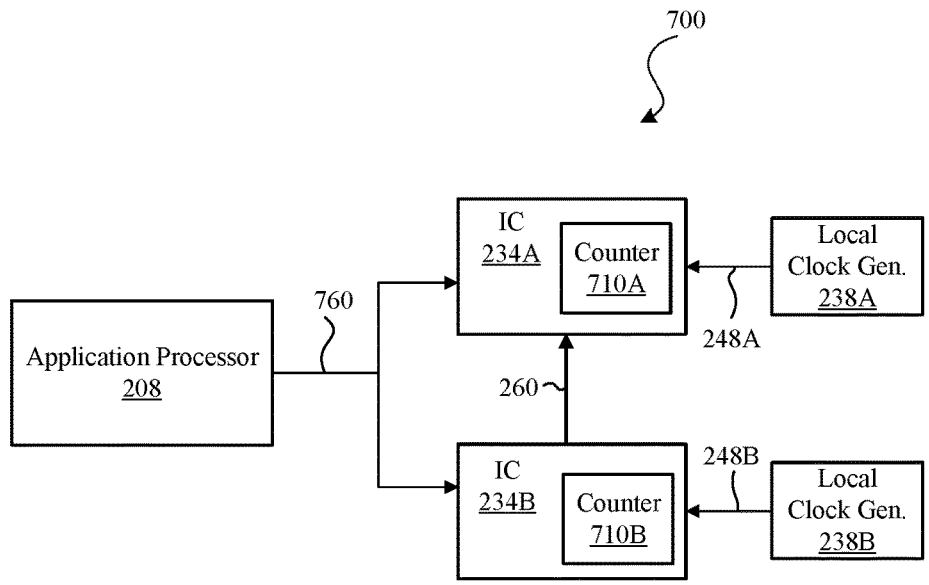
FIG. 7 is a block diagram of a system that uses a reference signal to determine relationships between local clock signals for the victim IC and the aggressor IC, according to one embodiment.

Instead of having spur parameter generation circuit 344 count the edges of both local clock signals 248A, 248B, reference signal 760 may be used to have IC 234A and IC 234B count the edges of their own local clock signals 248A, 248B for the same duration. FIG. 7 is a block diagram of system 700 that uses reference signal 760 to determine relationships between two local clock signals 248A, 248B, according to one embodiment. Similar to the embodiment of FIG. 2, local clock generation circuits 238A, 238B generate local clock signals 248A, 248B, respectively in the embodiment of FIG. 2. However, unlike the embodiment of FIG. 2, application processor 208 sends reference signal 760 to both ICs 234A, 234B, and IC 234A receives only local clock signal 248A but not local clock signal 248B in the embodiment of FIG. 7.

ICs 234A, 234B include counters 710A, 710B, respectively. Counter 710A counts edges in local clock signal 248A while counter 710B counts edges in local clock signal 248B according to trigger signals derived from reference signal 760. In one or more embodiments, the trigger signals may be generated at ICs 234A, 234B when rising edges or falling edges of reference signal 760 are detected.

Figure 8:
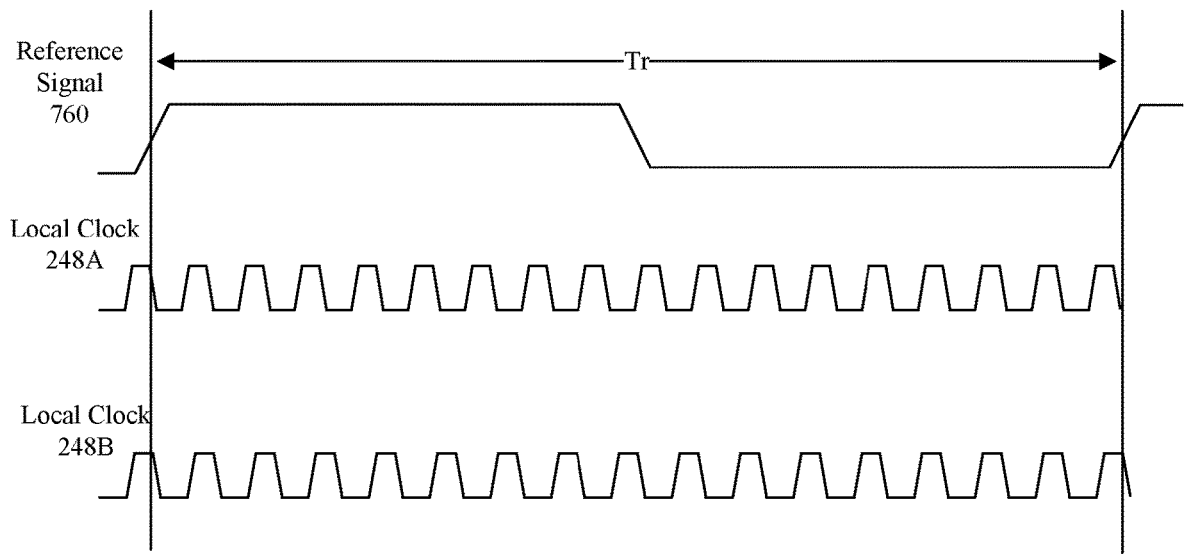
FIG. 8 is a timing diagram illustrating a reference signal and local clock signals, according to one embodiment.

FIG. 8 is a timing diagram illustrating counting of edges in local clock signals 248A, 248B over reference period Tr, according to one embodiment. In the example of FIG. 8, the reference period Tr may be a single cycle of reference signal 760. In other examples, reference period Tr may be multiple clock cycles or a fraction of a single clock cycle of reference signal 760. During reference period Tr, counters 710A, 710B tally the number of edges detected in local clock signals 248A, 248B, respectively. The same period Tr may be defined by the trigger signal generated by ICs 234A, 234B.

Then, IC 234B may send its count of the edges in local clock signal 248B over reference period Tr to IC 234A over P2P connection 260 or multi-drop bus 220. Spur parameter generation circuit 344 in IC 234A may receive the counts of edges from counters 710A, 710B and determine the ratio of the counts to be sent to spur cancellation circuits 348 as a spur parameter.

The embodiment of FIG. 7 obviates the need for IC 234A to receive local clock signal 248B and may simplify operations at IC 234A to determine the ratio of local clock frequencies. In other embodiments, reference local signal 760 may be provided by a separate clock generation circuit instead of being provided by application processor 208.

Example of Using Protection Information

As briefly described above with reference to FIG. 3, protection prioritizer 320 of IC 234A generates protection information for sending to IC 234B. For this purpose, protection prioritizer 320 analyzes the operating states of communication subsystems 336 and prioritizes frequency bands based on one or more factors. After analyzing, the protection prioritizer 320 generates the protection information that lists frequency bands to be protected and priority of these frequency bands as determined by prioritizer 320.

FIG. 9 is a diagram illustrating fields in the protection information generated by protection prioritizer 320, according to one embodiment. The protection information lists a number of frequency bands to be protected and their corresponding priority. The frequency band at the top of the protection information has the highest priority whereas the frequency bands in the lower portions of the protection information have lower priority.

The protection information may also include other information such as types of data being transmitted by certain bands of frequencies, signal strength of signals transmitted over the frequencies, active/inactive states of communication subsystems 338, frequency range to protect per carrier, and a priority related to the importance of the carrier for functional operation of the cellular link (e.g., whether the link is used for data communication or to monitor for possible reselection). This is merely an example, and various other types of information may be included in the protection information.

The generated protection information may be sent to IC 234B and other potential aggressor ICs in system 200 over a channel (e.g., P2P connection 260 or multi-drop bus 220).

The protection information may be sent to buffer 212 of hub device 210 for storage and retrieval by other ICs in system 200 that may become aggressor ICs. In this way, ICs that are placed in a sleep mode during transmission of the protection information may still retrieve the protection information from buffer 212 after they wake up from the sleep mode.

The protection information is received by subsystem controller 420 of IC 234B. After receiving the protection information, subsystem controller 420 may determine the operating frequencies of one or more of subsystems 436. In one or more embodiments, subsystem controller 420 searches operating frequencies useable by subsystems 436 but that do not fall under frequency bands listed in the protection information. If not all protected operating frequencies are avoidable, subsystem controller 420 may prioritize avoiding frequency bands of higher priority. In other embodiments, subsystem controller 420 may use its own algorithm to determine the frequency bands to be avoided which may use additional information not available to IC 234A, instead of relying solely on the priority of frequency bands listed in the protection information. Subsystem controller 420 may determine that transmission of certain types of data by IC 234A over a frequency band of a lower priority (as identified, for example, in the "other data" field of the protection information) is more important than data transmitted by frequency bands of higher priorities (as identified, for example, in the priority fields of the protection information); and hence, prioritize protecting the frequency bands for carrying the certain types of data. Subsystem controller 420 may also receive instructions or requests from application processor 208 or other ICs (e.g., IC 234N) to prioritize certain frequency bands. Subsystem controller 420 may take into account such instructions or requests to determine the operating frequencies of subsystem controller 420.

After determining operating frequencies and other configuration of subsystem controller 420, subsystem controller 420 sends configuration instructions to configure the operation of subsystems 436.

Such use of the priority information may be in addition to or in lieu of spur cancellation performed at a victim IC (e.g., IC 234A). By avoiding certain frequency bands pursuant to protection information from a victim IC in the same system, an increased number of ICs may be included in the system while reducing interference between the ICs.

Example Method of Performing Spur Cancellation

Figure 10:
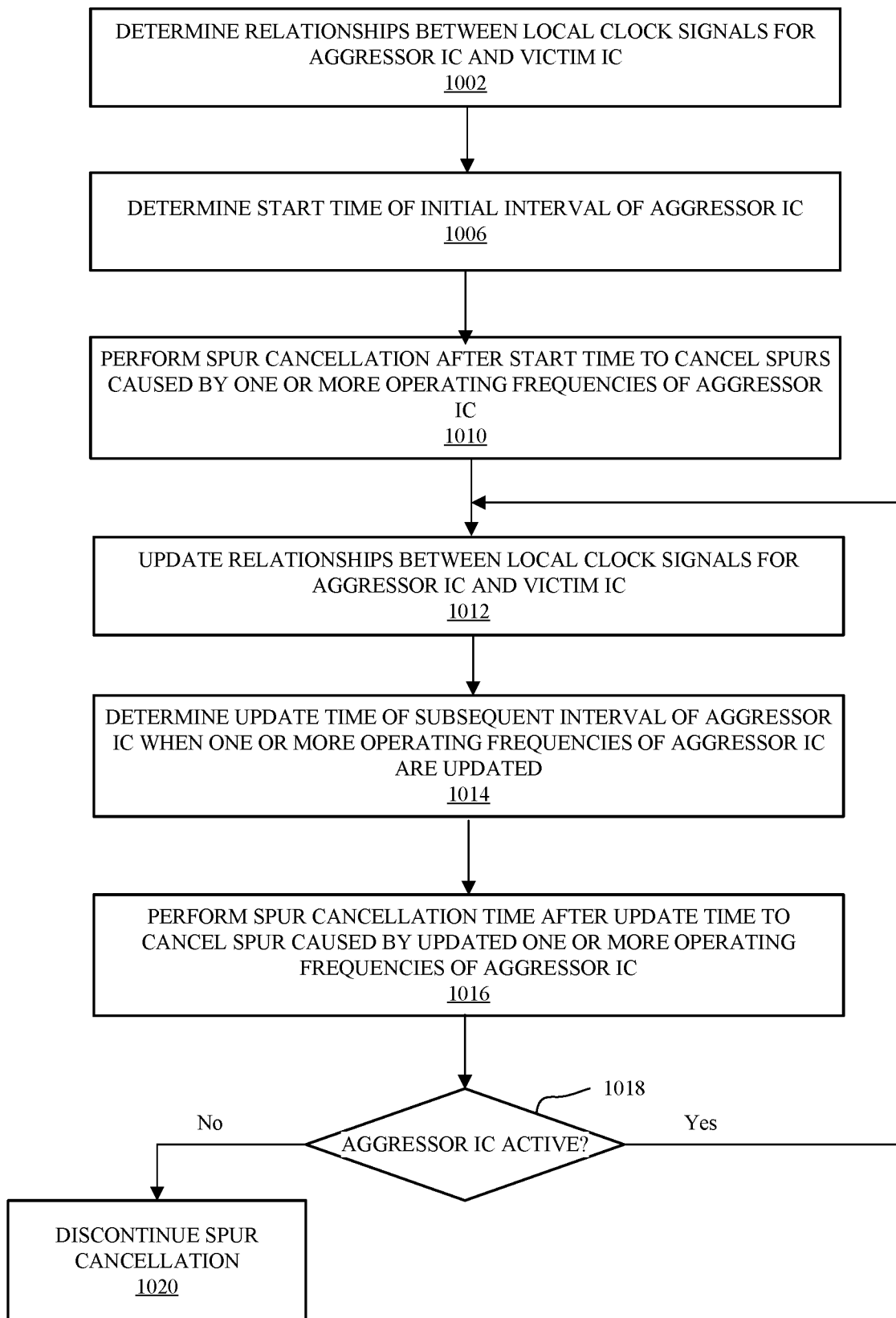
FIG. 10 is a flowchart illustrating a process of performing spur cancellation at the victim IC according to changes in operating frequencies of the aggressor IC, according to one embodiment.

FIG. 10 is a flowchart illustrating a process of performing spur cancellation at a victim IC according to changes in operating frequencies of an aggressor IC, according to one embodiment. In the above example described above with reference to FIG. 2, the victim IC is IC 234A and the aggressor IC is IC 234B. Relationships of a local clock signal for the victim IC and a local clock signal for the aggressor IC is determined 1002. The relationships may be a ratio of the frequencies of the two local clock signals.

A start time of an initial interval of the aggressor IC is determined 1006. The victim IC may read a message including operation information from the aggressor IC to determine the start time. The start time may be indicated in terms of a global clock time that is common to ICs in the system.

The victim IC may perform 1010 spur cancellation after the start time to cancel spurs caused by one or more operating frequencies of aggressor IC during the initial interval. For this purpose, the victim IC may generate spur parameters for configuring the spur cancellation circuits. The spur parameters indicate configuration of the spur cancellation circuits for effectively mitigating or cancelling the spurs generated by the aggressor IC.

The relationships between the local clock signal for the aggressor IC and the local clock signal of the victim IC is updated 1012 at a subsequent time. The frequencies of the local clock signals may drift due to changes in various factors such as temperature, pressure or supply voltage. Hence, the relationships between the local clock signals are updated to account for such change.

An update time at which a subsequent interval of aggressor IC starts is determined 1014. One or more operating frequencies of the aggressor IC are changed in the second interval relative to those of the first interval. The update time may be determined by reading a message including the operating information from the aggressor IC. In one or more embodiments, the initial interval and one or more subsequent intervals may repeat in a predetermined pattern.

The victim IC may perform 1016 spur cancellation after the update time according to the updated operating frequencies of the aggressor IC and the updated relationships between the local clock signals.

Then it is determined 1018 if the aggressor IC is active for a next interval. If not, the spur cancellation at the victim IC is discontinued. On the other hand, if the aggressor IC is still active for the next interval, the process returns to updating 1012 the relationships between the local clock signals and repeats the subsequent steps.

The processes and the sequence of the processes described above with reference to FIG. 10 are merely illustrative and various change may be made. For example, determining or updating the relationships between the local clock signals may be performed after determining the start time of the initial interval or the update time of the subsequent interval. Further, the relationships between the local clock signals may be continuously updated within the same interval.

ALTERNATIVE EMBODIMENTS

Although in the above embodiments, the operation information such as the start/update time and the operating frequencies are described as being provided by the aggressor IC (e.g., IC 234B), the same information may be provided by application processor 208 instead of the aggressor IC. In alternative embodiments, the aggressor IC may have limited capability and may not generate or send the operation information to a victim IC. In such embodiments, another IC such as application processor 208 may handle such operations and provide the operation information to the victim IC instead of the aggressor IC.

Further, above embodiments are described using an example where only one aggressor IC (e.g., IC 234B) generates spurs for a victim IC (e.g., IC 248A). However, the same principle may be applied to cases where a victim IC receives spurs from multiple aggressor ICs. In such cases, the victim IC may determine relationships between its local clock signal and local clock signals of multiple aggressor ICs, and receive operation information from multiple aggressor ICs. The victim IC may then perform spur cancellation to mitigate or cancel the spurs from multiple aggressor ICs.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method of performing spur cancellation at a first integrated circuit (IC), comprising:
    determining a local clock frequency of a second IC that operates in a repeating sequence of a first interval and a second interval subsequent to the first interval;
    determining a start time at which the second IC starts to operate with one or more first operating frequencies in the first interval;
    performing, based on the determined local clock frequency of the second IC, the spur cancellation on a signal of the first IC received from the start time to mitigate or remove spurs from the second IC operating with the one or more first operating frequencies;
    determining an update time at which the second IC starts to operate with one or more second operating frequencies in the second interval;
    determining a change in the local clock frequency of the second IC; and
    updating, based on the changed local clock frequency, the spur cancellation on the signal of the first IC from the update time to mitigate or remove the spurs from the second IC operating with the one or more second operating frequencies.

2. The method of claim 1, wherein the spur cancellation is performed by applying a first ratio between a local clock frequency of the first IC and the local clock frequency of the second IC, and the updated spur cancellation is performed by applying a second ratio between the local clock frequency of the first IC and the local clock frequency of the second IC.

3. The method of claim 2, wherein the first ratio is determined by comparing a number of edges in a local clock signal of the first IC and a number of edges in a local clock signal of the second IC during a first period before the start time, and wherein the second ratio is determined by comparing the number of edges in the local clock signal of the first IC and a number of edges in an updated local clock signal of the second IC during a second period before the update time and subsequent to the first period.

4. The method of claim 1, wherein determining the change in the local clock frequency comprises:
    receiving a reference clock signal at the first IC;
    receiving the reference clock signal at the second IC;
    determining a first count correlated with a local clock frequency of the first IC by using the reference clock signal;
    determining a second count correlated with the local clock frequency of the second IC by using the reference clock signal; and
    determining a second ratio as a function of the first count and the second count.

5. The method of claim 1, further comprising:
    receiving information on the repeating sequence and the update time; and
    storing the received information for updating the spur cancellation.

6. The method of claim 1, wherein determining the start time and the update time comprises:
    receiving the start time and the update time from a third IC that communicates with the first IC and the second IC via a multi-drop bus.

7. The method of claim 6, further comprising:
    storing the start time and the update time in a buffer of the first IC when the start time and the update time are received during a period in which a processor of the first IC is turned off; and
    sending the stored start time and updated time from the buffer to the processor responsive to the processor turning on.

8. The method of claim 1, wherein determining the start time and the update time comprises:
    receiving the start time and the update time from the second IC via a point-to-point connection.

9. The method of claim 1, wherein the first IC receives a global clock signal that is shared with the second IC, and wherein the first IC derives the start time and the update time from the global clock signal.

10. The method of claim 1, wherein the spur cancellation and the updated spur cancellation are performed on a digital signal derived from a wireless signal received by the first IC.

11. A first integrated circuit (IC), comprising:
    an interface circuit configured to determine a start time at which a second IC starts to operate in a repeating sequence of a first interval with one or more first operating frequencies, and determine an update time at which the second IC starts to operate in the repeating sequence of a second interval subsequent to the first interval with one or more second operating frequencies;
    a spur parameter generation circuit coupled to the interface circuit, the spur parameter generation circuit configured to:
        generate a first spur cancellation parameter indicative of the one or more first operating frequencies and a relationship between a local clock frequency of the first IC and a local clock frequency of the second IC, and
        generate a second spur cancellation parameter indicative of the one or more second operating frequencies and the relationship; and
    a spur cancellation circuit coupled to the spur parameter generation circuit to receive the first spur cancellation parameter and the second spur cancellation parameter from the spur parameter generation circuit, the spur cancellation circuit configured to:
        perform spur cancellation on a signal received from the start time according to the first spur cancellation parameter to mitigate or cancel spurs from at least one of the one or more first operating frequencies and harmonics of the one or more first operating frequencies, and
        update the spur cancellation on the signal received from the update time according to the second spur cancellation parameter to mitigate or cancel the spurs from at least one of the one or more second operating frequencies and harmonics of the one or more second operating frequencies.

12. The first IC of claim 11, wherein the relationship comprises a ratio of the local clock frequency of the first IC and the local clock frequency of the second IC.

13. The first IC of claim 12, wherein the spur parameter generation circuit is configured to determine, at a first time, the ratio by comparing a number of edges in a local clock signal of the first IC and the number of edges in a local clock signal of the second IC during a first period, and wherein the spur parameter generation circuit is configured to determine, at a second time, the ratio by comparing a number of edges in the local clock signal of the first IC and a number of edges in an updated local clock signal of the second IC during a second period subsequent to the first period.

14. The first IC of claim 11, wherein the spur parameter generation circuit is further configured to:
receive a reference clock signal;
determine a first count correlated with the local clock frequency of the first IC by using the reference clock signal;
receive a second count correlated with the local clock frequency of the second IC by using the reference clock signal; and
determine a ratio as a function of the first count and the second count.

15. The first IC of claim 11, further comprising a buffer configured to store information on the repeating sequence and the update time received from the second IC.

16. The first IC of claim 11, wherein the interface circuit is configured to receive the start time and the update time from a third IC that communicates with the first IC and the second IC via a multi-drop bus.

17. An electronic device comprising:
an aggressor integrated circuit (IC) configured to:
operate in a repeating sequence of a first interval with one or more first operating frequencies from a start time;
operate in the repeating sequence of a second interval subsequent to the first interval with one or more second operating frequencies from an update time; and
send the start time and the update time; and
a victim IC configured to:
determine a local clock frequency of the aggressor IC;
receive the start time from the aggressor IC;
perform, based on the determined local clock frequency of the aggressor IC, spur cancellation on a signal from the start time to mitigate or remove spurs from the aggressor IC operating with the one or more first operating frequencies based on the determined local clock frequency of the aggressor IC;
receive the update time from the aggressor IC;
determine a change in the local clock frequency of the aggressor IC; and
update, based on the changed local clock frequency, the spur cancellation on the signal from the update time to mitigate or remove the spurs from the aggressor IC operating with the one or more second operating frequencies.

18. The electronic device of claim 17, wherein the victim IC is configured to perform the spur cancellation by applying a first ratio between a local clock frequency of the victim IC and the local clock frequency of the aggressor IC, and wherein the victim IC is configured to perform the updated spur cancellation by applying a second ratio between the local clock frequency of the victim IC and the local clock frequency of the aggressor IC.

19. The electronic device of claim 18, wherein the victim IC is configured to determine the first ratio by comparing a number of edges in a local clock signal of the victim IC and a number of edges in a local clock signal of the aggressor IC during a first period before the start time, and wherein the victim IC is configured to determine the second ratio by comparing a number of edges in the local clock signal of the victim IC and a number of edges in an updated local clock signal of the aggressor IC during a second period before the update time and subsequent to the first period.

20. The electronic device of claim 17, wherein the start time and the update time are received from the aggressor IC via a point-to-point connection.

* * * * *